(12) United States Patent
Ackermann et al.

(10) Patent No.: US 12,265,105 B2
(45) Date of Patent: Apr. 1, 2025

(54) ELECTRICAL LOAD GROUPING (71) Applicant: SIGNIFY HOLDING B.V., Eindhoven (NL)

(72) Inventors: Bernd Ackermann, Aachen (DE); Matthias Wendt, Würselen (DE)

(73) Assignee: SIGNIFY HOLDING, B.V., Eindhoven (NL)

( * ) Notice: Subject to any disclaimer, the term of this patent is extended or adjusted under 35 U.S.C. 154(b) by 31 days.

(21) Appl. No.: 17/619,278

(22) PCT Filed: Jun. 22, 2020

(86) PCT No.: PCT/EP2020/067346
§ 371 (c)(1),
(2) Date: Dec. 15, 2021

(87) PCT Pub. No.: WO2020/260198
PCT Pub. Date: Dec. 30, 2020

(65) Prior Publication Data
US 2022/0299549 A1    Sep. 22, 2022

(30) Foreign Application Priority Data
Jun. 25, 2019 (EP) .................... 19182397

(51) Int. Cl.
*G01R 19/25* (2006.01)
*G01R 19/165* (2006.01)
*H02J 3/00* (2006.01)

(52) U.S. Cl.
CPC ....... *G01R 19/2513* (2013.01); *G01R 19/165* (2013.01); *H02J 3/007* (2020.01)

(58) Field of Classification Search
CPC .. G01R 19/2513; G01R 19/165; G01R 31/00; H02J 3/007
(Continued)

(56) References Cited

U.S. PATENT DOCUMENTS 9,323,233 B1 * 4/2016 Mohan ................ G05B 15/02
2008/0208491 A1   8/2008 Burlak et al.
(Continued)

FOREIGN PATENT DOCUMENTS

DE   102016218352 A1   4/2018
JP      2001074800 A    3/2001
(Continued)

OTHER PUBLICATIONS http://www.lighting.philips.com/main/systems/system-areas/recreational-sports.
(Continued)

*Primary Examiner* — Richard Tan (57) ABSTRACT

The invention is directed to electrical load grouping based on measurements of an electrical parameter at electrical load sensors (120A, 120B). An electrical load grouping device (110) is configured for receiving a changed value of the electrical parameter from one or more of the electrical load sensors (120A, 120B) in reaction to a changed power consumption of a respective electrical load (132A, . . . , 134C). The electrical load grouping device (110) is further configured for assigning the respective electrical load (132A, . . . , 134C) to a group (130A, 130B) of electrical loads associated to an electrical load sensor (120A, 120B) or groups of electrical loads associated to electrical load sensors based on which electrical load sensor (120A, 120B) or which electrical load sensors measured the changed value of the electrical parameter received in reaction to the changed power consumption of the respective electrical load (132A, . . . , 134C).

4 Claims, 6 Drawing Sheets

(58) Field of Classification Search
USPC .......................................................... 307/39
See application file for complete search history.

(56) References Cited

U.S. PATENT DOCUMENTS

| | | | |
|---|---|---|---|
| 2008/0231203 | A1 | 9/2008 | Budde et al. |
| 2009/0018706 | A1* | 1/2009 | Wittner ................. H02J 3/14 706/47 |
| 2010/0023284 | A1 | 1/2010 | Rodseth et al. |
| 2012/0083936 | A1 | 4/2012 | Van Vliet et al. |
| 2013/0024149 | A1 | 1/2013 | Nayar et al. |
| 2013/0270908 | A1* | 10/2013 | Wedel ..................... H02J 3/14 307/39 |
| 2014/0012524 | A1 | 1/2014 | Flammer, III |
| 2014/0247152 | A1 | 9/2014 | Proud |
| 2016/0043873 | A1 | 2/2016 | Wendt et al. |
| 2017/0135174 | A1 | 5/2017 | Aliakseyeu et al. |
| 2017/0346292 | A1* | 11/2017 | Handelsman ......... H02J 7/0068 |

FOREIGN PATENT DOCUMENTS

| | | | |
|---|---|---|---|
| JP | 2008290705 | A | 12/2008 |
| JP | 4877291 | B2 | 2/2012 |
| JP | 2016156723 | A | 9/2016 |
| WO | 2011091444 | A1 | 7/2011 |
| WO | 2014155366 | A1 | 10/2014 |
| WO | 2016008989 | A1 | 1/2016 |
| WO | 2017042283 | A1 | 3/2017 |
| WO | 2019026290 | A1 | 2/2019 |

OTHER PUBLICATIONS

Stosovic et al., "Monitoring and Classification of Nonlinear Loads Based on Artificial Neural Networks", Telsiks 2017, Serbia, Oct. 18-20, 2017, pp. 443-446.
Jouni Peppanen et al., "Secondary Circuit Model Generation Using Limited PV Measurements and Parameter Estimation", Jul. 17-21, 2016—IEEE Power and Energy Society General Meeting (PESGM).
Dzafic, M. Gilles et al., "Real Time Estimation of Loads in Radial and Unsymmetrical Three-Phase Distribution Networks", IEEE Trans. PowerSyst., vol. 28, No. 4, pp. 4839-4848, Nov. 2013.

* cited by examiner

FIG. 6

ELECTRICAL LOAD GROUPING

CROSS-REFERENCE TO PRIOR APPLICATIONS

This application is the U.S. National Phase application under 35 U.S.C. § 371 of International Application No. PCT/EP2020/067346, filed on Jun. 22, 2020, which claims the benefit of European Patent Application No. 19182397.0, filed on Jun. 25, 2019. These applications are hereby incorporated by reference herein.

FIELD OF THE INVENTION

The present invention relates to an electrical load grouping device, an electrical load system, a method for operating an electrical load grouping device, a method for grouping electrical loads of an electrical load system, a computer program product for grouping electrical loads, and a computer readable medium storing the computer program product.

BACKGROUND OF THE INVENTION

US 2016/0043873 A1 shows a DC power distribution system. The system is adapted such that power conductors electrically connected to different groups of ports belong to separate power line communication (PLC) channels, wherein several electrical loads are in power line communication with a group of ports of a same PLC channel. The separation of the different PLC channels allows for a determination to which group of ports which electrical loads are electrically connected.

SUMMARY OF THE INVENTION

It can be seen as an object of the present invention to provide an electrical load grouping device, an electrical load system, a method for operating an electrical load grouping device, a method for grouping electrical loads of an electrical load system, a computer program product for grouping electrical loads, and a computer readable medium storing the computer program product which allow grouping of electrical loads within a reduced period of time.

In a first aspect of the present invention an electrical load grouping device for grouping electrical loads is presented. The electrical loads are arranged at different locations in an electrical load system. The grouping of the electrical loads is based on measurements of an electrical parameter at electrical load sensors. The electrical load sensors are arranged such that each of them can measure the electrical parameter of one or more of the electrical loads. The electrical load grouping device is configured for receiving a changed value of the electrical parameter from one or more of the electrical load sensors in reaction to a changed power consumption of a respective electrical load. The electrical load grouping device is further configured for assigning the respective electrical load to a group of electrical loads associated to an electrical load sensor or groups of electrical loads associated to electrical load sensors based on which electrical load sensor or which electrical load sensors measured the changed value of the electrical parameter received in reaction to the changed power consumption of the respective electrical load.

Since the electrical load grouping device is configured for assigning the respective electrical load to a group or groups of electrical loads based on which electrical load sensor or electrical load sensors measured the changed value of the electrical parameter automatic grouping can be provided. Automatic grouping requires less time than manual grouping of electrical loads. Furthermore, a more accurate grouping can be achieved compared to manual grouping, as well as to a grouping performed based on nearfield communication, such as Bluetooth communication between the electrical loads and an electrical load grouping device. The grouping can be triggered by the electrical load grouping device. The electrical load grouping device allows to perform an automatic grouping without requiring to provide identifier information from the electrical loads to the electrical load grouping device. Thus, the electrical load grouping device does not need to receive any identifier information, such as electrical load identifier or electrical load location, of the respective electrical load for grouping it. This can allow to reduce data traffic between the electrical loads and the electrical load grouping device. In particular, in case that the electrical loads and the electrical load grouping device are connected via power lines and power line communication is used for data communication, cross talk between the power lines can be reduced by reducing the data traffic.

The electrical parameter can include power, voltage, current, or any other electrical parameter.

The electrical load grouping device can also be configured for receiving changed values of electrical parameters if the electrical load sensors measure more than one electrical parameter. The electrical load grouping device can be configured for assigning the respective electrical load to a group or groups of electrical loads based on the changed values of the electrical parameters.

The electrical load grouping device can be configured for assigning the respective electrical load to a group of electrical loads associated to an electrical load sensor that measured the changed value of the electrical parameter received in reaction to the changed power consumption of the respective electrical load or to groups of electrical loads associated to electrical load sensors that measured the changed value of the electrical parameter received in reaction to the changed power consumption of the respective electrical load.

A group of electrical loads can for example include electrical loads that are functionally related, spatially related, or functionally and spatially related. Functionally related electrical loads can for example include electrical loads that are connected in order to perform a function. Spatially related electrical loads can include loads arranged in a specific area, such as in a specific room or in a diameter of a specific position.

The electrical loads can for example be assigned to groups of electrical loads arranged in a room, a building, or a city. For example, electrical loads arranged in an office room can form a group of electrical loads and/or electrical loads in an area of the office room can form a group of electrical loads. The electrical load sensors can be arranged such that meaningful groups can be formed, e.g., such that electrical loads in one room form one group and electrical loads in another room form another group. This can allow to automatically group electrical loads in a manner such that they can be conveniently controlled based on which group they belong to. For example, all electrical loads in one room can be conveniently activated or deactivated if they are all assigned to one group. Furthermore, electrical loads in one or more groups of electrical loads can be controlled simultaneously, e.g., by activating the electrical loads of one group while deactivating the electrical loads of another group.

The electrical load grouping device can be configured for triggering the changed power consumption of the respective electrical load. This can allow the electrical load grouping device to trigger a change of the power consumption of each electrical load individually, and to receive the reaction to a changed power consumption of a respective electrical load via a changed value of the electrical parameter from the respective electrical load sensor. Since the changed power consumption is triggered by the electrical load grouping device, the information which electrical load changes its power consumption is known in the electrical load grouping device. Thus, the electrical load does not need to provide this information to the electrical load grouping device. The electrical load grouping device can be configured for assigning the respective electrical load which it triggered to change its power consumption to one or more groups of electrical loads based on which of the electrical load sensors measured the changed value of the electrical parameter received in reaction to the changed power consumption of the respective electrical load.

The electrical load grouping device can be configured for triggering the changed power consumption of the respective electrical load using various methods. The electrical load grouping device can for example be configured for transmitting a change power consumption signal to the respective electrical load for changing its power consumption. The electrical load grouping device can comprise a transceiver for transmitting the change power consumption signal to the respective electrical load for changing its power consumption and for receiving the changed value of the electrical parameter from the one or more of the electrical load sensors in reaction to the changed power consumption of the respective electrical load. The transceiver can be a wireless transceiver. Alternatively, wire based communication can be used, e.g., wires connecting the electrical loads, electrical load sensors, and electrical load grouping device.

The electrical load grouping device can comprise a load switch and/or a circuit breaker for connecting and disconnecting one or more groups of electrical loads with the electrical load grouping device. The electrical load grouping device can comprise one or more load switches. Alternatively or additionally the electrical load grouping device can comprise one or more circuit breakers. Providing the electrical load grouping device with a load switch can allow for improved controllability of the electrical loads. Providing the electrical load grouping device with a circuit breaker allows for improved operational safety. The circuit breaker is configured for disconnecting an electrical load or a group of electrical loads connected to the electrical load grouping device via the circuit breaker when a current exceeds a threshold amount. This allows interrupting a current flow in order to protect the electrical load or the group of electrical loads connected to the electrical load grouping device from damage caused by excess current from an overload or short circuit. The load switch is configured for establishing a connection between the electrical load grouping device and one or more electrical loads when the load switch is in a closed state. If the load switch is in an open state, the electrical load grouping device is disconnected from the one or more electrical loads. The load switch can be configured to be operated manually, e.g. by a wall mounted manual control switch, or automatically, e.g. based on a triggering signal for switching the load switch between the open state and the closed state. The electrical load grouping device can be connected to mains and can be configured for providing power to the electrical loads when the load switch connects the electrical load grouping device with the electrical loads.

This can allow to connect and disconnect the electrical loads in order to perform peak shaving. Peak shaving corresponds to a process of reducing an amount of power received from mains during times when prices are high, e.g. during peak demand hours. The electrical loads can include an energy storage for storing energy and store energy during times when prices for power are low. The electrical loads can use the stored energy for powering the electrical loads during times when prices are high. This allows to reduce costs and to unburden the mains.

The electrical load grouping device can comprise a database for storing assignments of the electrical loads to the groups of electrical loads. Assignments include information about which electrical load is assigned to which group or groups of electrical loads. The database can comprise a lookup table (LUT). An assignment of an electrical load to one or more groups of electrical loads can for example be stored in the LUT. The LUT can include a list of electrical load identifiers and group identifiers for the electrical loads, such that one or more group identifiers are associated to each of the electrical loads. A respective electrical load can for example be assigned to two separate groups associated to two different electrical load sensors, e.g., if the respective electrical load is arranged in an overlapping region of at least two groups associated to two different electrical load sensors. An overlapping region is defined as a region, in which an electrical load is assigned to more than one group of electrical loads. For example, an electrical load arranged in a room on a specific floor can be assigned to the group of electrical loads on the specific floor and the group of electrical loads in the room. Using the database allows identifying electrical loads automatically. For example, every time when the electrical loads are removed from their location and reinstalled, e.g. after a renovation, the database can be used for identifying the electrical loads in order to check whether the electrical loads have been correctly reinstalled, i.e., at their correct locations. For example, one or more electrical loads may be reinstalled at wrong locations. In such a case the database allows for identifying the electrical load or electrical loads at the wrong locations. After identifying the electrical load or electrical loads that have been reinstalled at wrong locations, a regrouping can be initiated only for them. This can allow to reduce the amount of processing for grouping the electrical loads.

Alternatively or additionally, each of the electrical loads can store its electrical load identifier and group identifier or group identifiers itself. This can allow to control a respective electrical load individually or to control a group of electrical loads without the need to store assignments at the electrical load grouping device. Thus the electrical load grouping device can for example be replaced if it is broken without losing the grouping of the electrical loads. This may allow for a more robust system. The electrical loads can include a computer readable medium for storing their electrical load identifier and/or group identifier. The computer readable medium can also include the database for storing assignments of the electrical loads to the groups.

The electrical loads can be configured for transmitting their assignment to the one or more groups of electrical loads to the electrical load grouping device. The electrical loads can be controlled based on control signals directed to their respective group or groups based on the group identifier. This allows control of groups of electrical loads based on group identifiers without the need to individually address the respective electrical loads of a group. For example, when a control signal including commands regarding the respective group identifier are received at an electrical load with the respective group identifier, the commands will be processed. If an electrical load with another group identifier receives the control signal, the commands will be ignored.

The electrical load grouping device can comprise a computer readable medium including the database.

In a further aspect of the present invention an electrical load system is presented. The electrical load system comprises electrical loads, electrical load sensors, and an electrical load grouping device according to claim 1 or any embodiment of the electrical load grouping device. The electrical loads are arranged at different locations. The electrical load sensors are arranged such that each of them can measure the electrical parameter of one or more of the electrical loads and such that a group of electrical loads is associated to an electrical load sensor. The electrical load system can for example be a connected lighting (CL) system, a heating ventilation air conditioning (HVAC) system, a home automation system, a direct light control system or a combination thereof. An electrical load system including an electrical load grouping device according to claim 1 or any embodiment of the electrical load grouping device allows for automatic grouping of the electrical loads of the electrical load system. The grouping may be performed within a shorter period of time, with higher accuracy, and/or with reduced data traffic.

The electrical load grouping device can for example comprise, be or be included in a smart meter or an electricity meter. A smart meter can be configured for measuring and storing information about consumption of electric energy and for communicating this information to a server.

The electrical load system can have a wired or a wireless connection between the electrical load grouping device and the electrical loads such that the power consumption of a respective electrical load is adjustable via the connection. The connection can for example include a power conductor, such as a power cable. The power conductor can alternatively also for example be an optical fiber. The electrical load system can comprise an electrical installation. The electrical installation can be an installation of cabling and the devices of the electrical load system including the electrical load grouping device, the electrical loads and the electrical load sensors.

The electrical load sensors can be connected to or included in load switches and/or circuit breakers. The electrical load sensors can be configured for measuring an electrical parameter, such as power, current, voltage, or any other electrical parameter. The electrical parameter of all electrical loads connected to a respective electrical load sensor can be measured by the respective electrical load sensor. Thus, a changed value of the electrical parameter can be measured by the electrical load sensor in reaction to a changed power consumption of any of the electrical loads connected to the electrical load sensor.

The electrical load system can comprise a power source for providing the electrical loads with power. Alternatively or additionally, the electrical load system can be connected to a power source, e.g. to mains. The electrical load system can be configured for providing the power to the electrical loads via the electrical load grouping device. The electrical load system can for example be connected to the mains via the electrical load grouping device. The electrical load grouping device can be connected to the electrical loads via one or more power conductors. The electrical loads can be connected to the power source via the power conductors and the electrical load grouping device. The power conductors can be configured for transmitting power optically, electrically, via induction or in any other manner that changes an electrical parameter of the respective electrical load.

In the electrical load system an electrical load sensor can be arranged in series with another electrical load sensor, such that the electrical load sensor arranged in series with the other electrical load sensor can measure the electrical parameter of one or more of the electrical loads of a group of electrical loads associated to the other electrical load sensor. The one or more of the electrical loads form a subgroup of the group of electrical loads associated to the other electrical load sensor, the subgroup of electrical loads being associated to the electrical load sensor arranged in series with the other electrical load sensor. The electrical load system having an electrical load sensor arranged in series with another electrical load sensor can allow assigning an electrical load to two or more groups of electrical loads, in which one of the groups is a subgroup of the other group of electrical loads. For example, all electrical loads in a room can be assigned to a group of electrical loads and additionally some of the electrical loads are assigned to a first subgroup, while some others of the electrical loads are assigned to a second subgroup. For example, the electrical loads in area of the room, e.g. close to a window of the room can be assigned to the first subgroup, while electrical loads on the opposite side of the room close to a door can be assigned to the second subgroup. Assigning electrical loads to groups and subgroups allows improved control of the electrical loads, as commands can be used for controlling the whole group of electrical loads or only one of the subgroups of the electrical loads.

The electrical load system can comprise more than two electrical load sensors in series, e.g., a series of three of more electrical load sensors. This allows to assign an electrical load to more than two groups of electrical loads, e.g., to three groups of electrical loads, such that a respective electrical load can be assigned to a group of electrical loads, to a subgroup of the group of electrical loads and to a subgroup of the subgroup, i.e., a subsubgroup of the group of electrical loads.

The electrical load grouping device of the electrical load system can be configured for assigning a respective electrical load to more than one group. The respective electrical load can for example be assigned to one or more groups of electrical loads and one or more subgroups of electrical loads. The electrical load can for example be assigned to a group of electrical loads and a subgroup of the group of electrical loads. In another embodiment, the electrical load can be arranged in an overlapping region of two groups of electrical loads and/or subgroups of the groups of electrical loads. The overlapping region of two groups of electrical loads is a region in which an electrical load can be assigned to more than one group of electrical loads.

The electrical load system can comprise a subgrouping device connected to the electrical load grouping device. The subgrouping device can comprise the electrical load sensor arranged in series with the other electrical load sensor. The subgrouping device can allow to assign a respective electrical load to one group of electrical loads and a subgroup of the group of electrical loads. The subgrouping device can comprise one or more electrical load sensors arranged in series with the other electrical load sensor. The electrical load system can comprise one or more subgrouping devices.

The electrical load system can comprise one or more load switches and/or one or more circuit breakers. One or more of the load switches and/or one or more of the circuit breakers can be included in the electrical load grouping device. The load switch and/or the circuit breakers can be configured for connecting or disconnecting the electrical load grouping device with one or more groups of electrical loads. The load switches can allow to perform peak shaving and may improve control of the groups of electrical loads. The circuit breaker can improve operational safety.

The subgrouping device can comprise a load switch and/or a circuit breaker for connecting and disconnecting the subgroup of electrical loads with the subgrouping device. The subgroup of electrical loads is the subgroup of electrical loads associated to the electrical load sensor arranged in series with the other electrical load sensor. The subgrouping device can for example be a fuse box. The subgrouping device can also comprise one or more load switches and/or one or more circuit breakers. This may allow improved control and/or improved operational safety.

The electrical load sensors can be connected to or included in the load switches and/or circuit breakers of the subgrouping device.

Load switches can be included in the electrical load grouping device and the subgrouping device. Alternatively, load switches can be included in the electrical load grouping device and remote load switches can be included in the subgrouping device. Alternatively, remote load switches can be included in the electrical load grouping device and the subgrouping device. Remote load switches can be configured to be remotely controlled, e.g., from a remote control unit, the electrical load grouping device, or any other device that is configured for remotely controlling the remote load switches. Remote control of the remote load switches can for example be performed using a connection, e.g., wired or wireless connection, between the remote control unit and the remote load switches. Remote control can for example be performed via power line communication.

The electrical load system can comprise an event sensor for detecting an event. The subgrouping device can be configured for connecting and disconnecting the subgroup of electrical loads with the subgrouping device based on the detected event. Alternatively or additionally, the electrical load grouping device can be configured for connecting and disconnecting the group of electrical loads with the electrical load grouping device based on the detected event. This may allow an improved control of the electrical load system, namely based on detected events. The event sensor can include a motion sensor, a presence sensor, or any other type of sensor configured for detecting an event. A motion sensor can be configured for perceiving motion events. A presence sensor can be configured for detecting presence of a subject or an object.

The event sensor can be configured for providing a detection signal when it detects an event. The electrical load system can be configured for providing the detection signal to the electrical load grouping device for causing the electrical load grouping device to connect or disconnect the group of electrical loads with the electrical load grouping device based on the detected event and/or to the subgrouping device for causing the subgrouping device to connect or disconnect the subgroup of electrical loads with the subgrouping device based on the detected event. For example, the event sensor can be a motion sensor for detecting a motion. The motion sensor can be arranged close to a group of electrical loads which are connected to a power source via the electrical load grouping device. The electrical load grouping device can be configured for connecting the group of electrical loads with the electrical load grouping device in order to provide power to them when a motion is detected by the motion sensor. Load switches in the electrical load grouping device can be switched to a closed state in order to connect the electrical load grouping device with the electrical loads of the group of electrical loads. This allows to control providing of power to the electrical loads based on detected events.

At least one of the electrical loads can comprise an event sensor for detecting an event. The event sensor can be configured for activating or deactivating its electrical load when it detects an event. The event sensor can also be configured for activating or deactivating the electrical loads of the group or subgroup to which its electrical load is associated.

The electrical load system can comprise a control unit configured for controlling the electrical loads. The control unit can be configured for activating or deactivating the electrical loads, such as one or more groups of electrical loads. The control unit can also be configured for controlling the load switches for connecting and disconnecting the electrical load grouping device and/or the subgrouping device with the electrical loads. This allows for controlling the electrical loads and/or the electrical load system via a control unit.

The control unit can be included in the electrical load grouping device.

The electrical load system can be configured for providing the detected event to the control unit. The control unit can be configured for controlling the electrical loads based on the detected event.

In an embodiment, the electrical load system can be a CL system in which the electrical load grouping device includes the control unit for wirelessly controlling the electrical loads and at least one electrical load is a luminaire. In other examples the electrical load system can be a HVAC system and the electrical loads can for example include an air conditioning device, a ventilation device, a heating device, a cooling device, or any other HVAC device.

The control unit can be configured for changing the power consumption of one or more electrical loads or groups of electrical loads.

The control unit can be configured for wirelessly controlling the electrical loads. The control unit can include or be connected to a user interface. The user interface can for example be a wall mounted manually controlled switch or a wall mounted touch screen for manual control. Since the control unit can be configured for wirelessly controlling the electrical loads, groups of electrical loads that are not electrically connected to the user interface can be activated using the user interface. For example, if a wall mounted manually controlled switch is initially configured for activating electrical loads in a room, and another electrical load close to the room is grouped together with the electrical loads, switching the wall mounted manually controlled switch can activate the electrical load close to the room. Therefore, the control unit can receive an activation command from the wall mounted manually controlled switch for a specific group of electrical loads and the control unit can activate the electrical loads of the specific group of electrical loads. For example, a front door luminaire can be activated each time corridor luminaires are activated by a wall mounted manually controlled corridor switch. This can allow to adjust controls of user interfaces in the electrical load system. The control unit can activate more electrical loads than are electrically connected to the user interface. The electrical load system can also be configured for detecting a user interface without connectivity to one or more electrical loads.

In a further aspect of the present invention a method for operating an electrical load grouping device according to claim 1 or any embodiment of the electrical load grouping device is presented. The method comprises the steps:

receiving a changed value of the electrical parameter from one or more of the electrical load sensors in reaction to a changed power consumption of a respective electrical load, assigning the respective electrical load to a group of electrical loads associated to an electrical load sensor or groups of electrical loads associated to electrical load sensors based on which electrical load sensor or which electrical load sensors measured the changed value of the electrical parameter received in reaction to the changed power consumption of the respective electrical load.

A value of the electrical parameter measured by the one or more electrical load sensors can be changed in reaction to a changed power consumption of a respective electrical load. The assigning of the respective electrical load to a group of electrical loads or groups of electrical loads can be performed by assigning the respective electrical load to a group of electrical loads associated to an electrical load sensor that measured the changed value of the electrical parameter received in reaction to the changed power consumption of the respective electrical load or to groups of electrical loads associated to electrical load sensors that measured the changed value of the electrical parameter received in reaction to the changed power consumption of the respective electrical load.

The method can include a step of triggering a changed power consumption of a respective electrical load. The method can include a step of transmitting a change power consumption signal to a respective electrical load for changing its power consumption. The change power consumption signal can be transmitted by the electrical load grouping device to the respective electrical load for changing its power consumption. The changed value of the electrical parameter can be received by the electrical load grouping device from the one or more of the electrical load sensors. The method can allow triggering a change of the power consumption of each electrical load individually and grouping the electrical loads automatically based on which electrical load sensor measured the changed value of the electrical parameter.

In a further aspect of the present invention a method for grouping electrical loads of any embodiment of the electrical load system in which an electrical load sensor is arranged in series with another electrical load sensor is presented. The method comprises the steps:

receiving at the electrical load grouping device a changed value of the electrical parameter from one or more of the electrical load sensors in reaction to a changed power consumption of a respective electrical load, assigning by the electrical load grouping device the respective electrical load to a group of electrical loads associated to an electrical load sensor or groups of electrical loads associated to electrical load sensors based on which electrical load sensor or which electrical load sensors measured the changed value of the electrical parameter received in reaction to the changed power consumption of the respective electrical load, wherein the respective electrical load is assigned to a group of electrical loads and a subgroup of electrical loads if an electrical load sensor that measured the changed value of the electrical parameter received in reaction to the changed power consumption of the respective electrical load is arranged in series with another electrical load sensor that measured the changed value of the electrical parameter received in reaction to the changed power consumption of the respective electrical load.

The method can include a step of triggering a changed power consumption of the respective electrical load. The changed power consumption can be triggered by the electrical load grouping device. The method can include a step of transmitting a change power consumption signal to a respective electrical load for changing its power consumption. The change power consumption signal can be provided from the electrical load grouping device. Assigning of the respective electrical load to a group of electrical loads and a subgroup of electrical loads can allow an improved control of the electrical loads. For example, the electrical load grouping device can transmit a change power consumption signal to an electrical load and trigger a changed power consumption of the electrical load. The changed power consumption of the electrical load can for example change the value of the electrical parameter of two electrical load sensors. In reaction, the electrical load grouping device assigns the respective electrical load to a subgroup of a group of electrical loads and the group of electrical loads. The respective electrical load can be controlled by commands directed to the group or the subgroup of electrical loads.

In a further aspect of the present invention a computer program product for grouping electrical loads is presented. The computer program product can comprise program code means for causing the electrical load grouping device according to any embodiment of the electrical load grouping device to carry out the method as defined in any embodiment of the method for operating the electrical load grouping device, when the computer program product is run on the electrical load grouping device. Alternatively or additionally, the computer program product can comprise program code means for causing the electrical load grouping device according to any embodiment of the electrical load grouping device to carry out any embodiment of the method for grouping the electrical loads, when the computer program product is run on the electrical load grouping device in an electrical load system in which an electrical load sensor is arranged in series with another electrical load sensor.

A computer readable medium can have stored the computer program product according to any embodiment of the computer program product.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
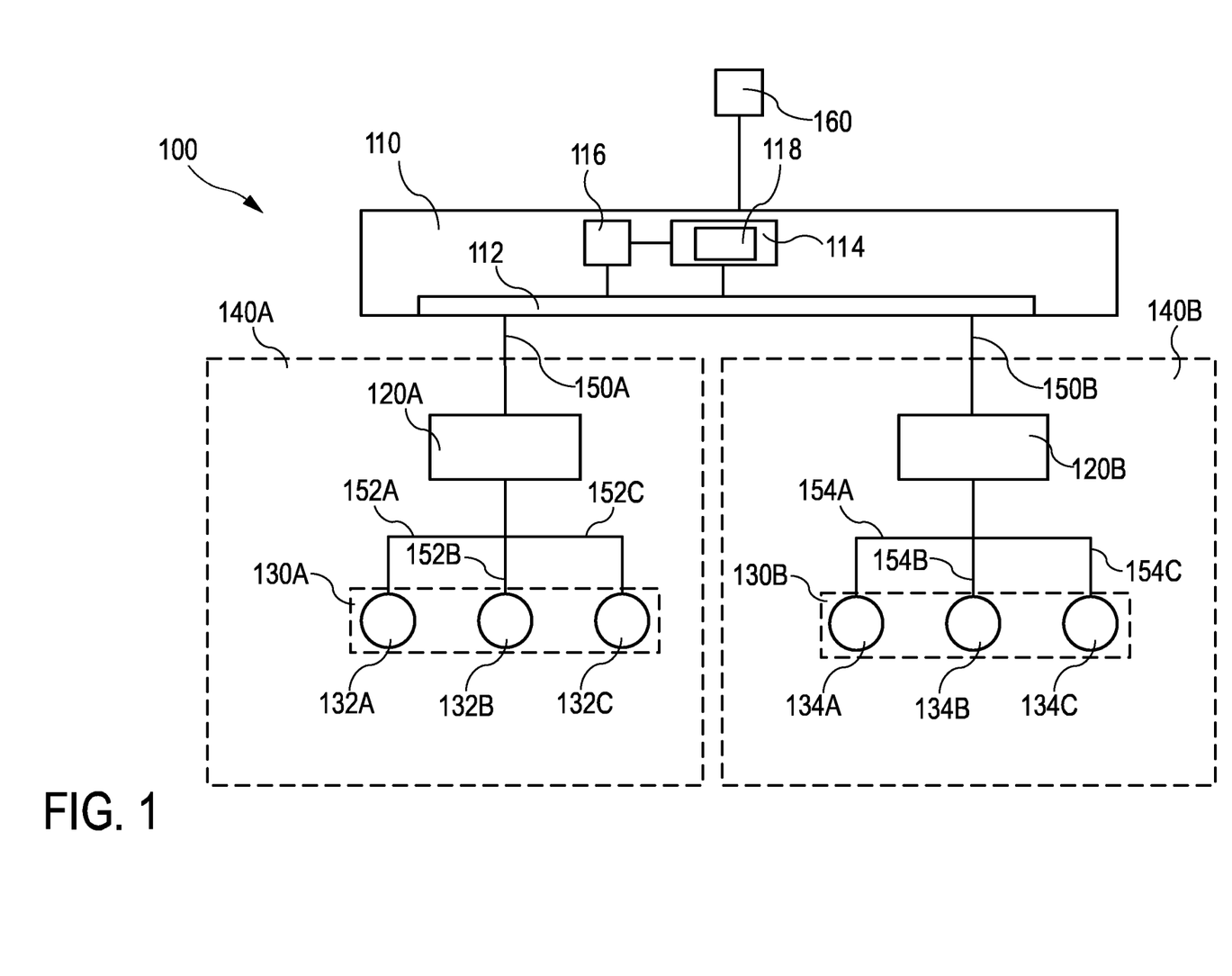
FIG. 1 shows schematically and exemplarily a first embodiment of an electrical load system including an electrical load grouping device and electrical loads.

FIG. 1 shows schematically and exemplarily a first embodiment of an electrical load system in form of a CL system 100. The CL system 100 can be used for grouping electrical loads, such as luminaires arranged at different locations in the CL system 100 and controlling lighting in a building, such as a house or factory. In other embodiments, the electrical load system can also be a HVAC system, a building management system (BMS), a direct light control system, or a home automation system. The CL system 100 is part of an electrical installation in this embodiment.

The CL system 100 comprises an electrical load grouping device in form of a smart meter 110, electrical load sensors in form of power sensors 120A and 120B, and electrical loads in form of luminaires 132A, 132B, 132C, 134A, 134B, and 134C. The luminaires 132A, 132B, 132C, 134A, 134B, and 134C are arranged at different locations of two different rooms 140A and 140B in this embodiment. In other embodiments the electrical loads can also be arranged in different areas, floors, or buildings, e.g. houses or factories. The power sensor 120A is arranged such that it can measure the power of the luminaires 132A, 132B, and 132C. The luminaires 132A, 132B, and 132C are connected to the power sensor 120A via power conductors in form of power cables 152A, 152B, and 152C. The power sensor 120B is arranged such that it can measure the power of the luminaires 134A, 134B, and 134C. The luminaires 134A, 134B, and 134C are connected to the power sensor 120B via power conductors in form of power cables 154A, 154B, and 154C. The smart meter 110 is connected to mains 160 which provides power to the CL system 100 and in particular the luminaires 132A, 132B, 132C, 134A, 134B, and 134C via the smart meter 110.

In other embodiments electrical load sensors can measure other electrical parameters, e.g. current or voltage, of one or more of the luminaires. In other embodiments the power conductors can also for example be optical fibers or any other type of power conductor.

The smart meter 110 can group the luminaires 132A, 132B, 132C, 134A, 134B, and 134C based on measurements of the power at the power sensors 120A and 120B. In other embodiments the electrical load grouping device can group electrical loads arranged at different locations in the electrical load system based on measurements of any other electrical parameter, e.g. current or voltage, at the electrical load sensors.

The smart meter 110 comprises a transceiver 112, a computer readable medium in form of memory 114, and a control unit in form of processor 116. The memory 114 includes a database 118.

The transceiver 112 triggers a changed power consumption of a respective one of the luminaires 132A, 132B, 132C, 134A, 134B, or 134C by transmitting a change power consumption signal to the respective one of them. In this embodiment the change power consumption signal is transmitted via the power cables 150A to 154C to the respective luminaire. In other embodiments the change power consumption signal can also be transmitted wirelessly to the respective electrical load. In other embodiments, the electrical load grouping device can also be configured for triggering a changed power consumption of a respective electrical load based on another method for triggering a changed power consumption of the respective electrical load.

The respective luminaire 132A, 132B, 132C, 134A, 134B, or 134C changes its power consumption in reaction to the change power consumption signal. The change power consumption signal in this embodiment corresponds to a changed dim level of the respective luminaire 132A, 132B, 132C, 134A, 134B, or 134C. In other embodiments the change power consumption signal can also be any other command that changes the power consumption of a respective electrical load, e.g., activating or deactivating one or more functions of the electrical load.

The power sensor 120A or 120B measures a changed power value in reaction to the changed power consumption of the respective luminaire 132A, 132B, 132C, 134A, 134B, or 134C and transmits it to the transceiver 112 via the power cable 150A or 150B. The transceiver 112 receives the changed power value and provides it to the processor 116. In other embodiments, the electrical load sensors can communicate wirelessly with the electrical load grouping device. In yet other embodiments, the electrical load sensors can be included in the electrical load grouping device. In other embodiments, the electrical load grouping device can receive a changed value of any other electrical parameter from one or more of the electrical load sensors in reaction to the changed power consumption of the respective electrical load.

The processor 116 assigns the respective luminaire 132A, 132B, 132C, 134A, 134B, or 134C to a group of luminaires 130A or 130B that is associated to the power sensor 120A or 120B that measured the changed power value received in reaction to the changed power consumption of the respective luminaire 132A, 132B, 132C, 134A, 134B, or 134C. In this embodiment, the luminaires 132A, 132B, and 132C are assigned to the group of luminaires 130A and the luminaires 134A, 134B, and 134C are assigned to the group of luminaires 130B. In other embodiments, the electrical load grouping device can assign the respective electrical load to a group of electrical loads associated to the electrical load sensor or groups of electrical loads associated to the electrical load sensors based on which electrical load sensor or which electrical load sensors measured the changed value of the electrical parameter received in reaction to the changed power consumption of the respective electrical load. For example, changed values of other electrical parameters can be considered for assigning the electrical load to one or more groups.

The assignments of the luminaires 132A, 132B, 132C, 134A, 134B, and 134C are stored in the database 118. In this embodiment, the database 118 stores the assignments within a lookup table (LUT). Hence, the assignments of the luminaires 132A, 132B, 132C, 134A, 134B, and 134C to the groups of luminaires 130A and 130B are stored in form of a LUT. The LUT includes a list of luminaire identifiers for the luminaires 132A, 132B, 132C, 134A, 134B, and 134C and group identifiers for the groups 130A and 130B, such that the luminaires 132A, 132B and 132C are assigned to group 130A and the luminaires 134A, 134B, and 134C are assigned to group 130B, e.g., the luminaire identifier of luminaire 132A is assigned to the group identifier of group 130A and the luminaire identifier of luminaire 134C is assigned to the group identifier of group 130B.

The memory 114 furthermore stores a computer program product for operating the smart meter 110. The computer program product includes program code means for causing the smart meter 110 to carry out a method for operating the smart meter 110 when the computer program product is run on the smart meter 110, e.g., the method as presented in FIG. 5. The memory 114 additionally stores a computer program product for grouping electrical loads of the CL system 100. The computer program product includes program code means for causing the smart meter 110 to carry out a method for grouping the electrical loads of the CL system 100 when the computer program product is run on the smart meter 110, e.g., the method as presented in FIG. 6. The memory 114 further includes a computer program product for operating the CL system 100, i.e., for controlling the luminaires of the CL system 100 in order to provide lighting.

Figure 2:
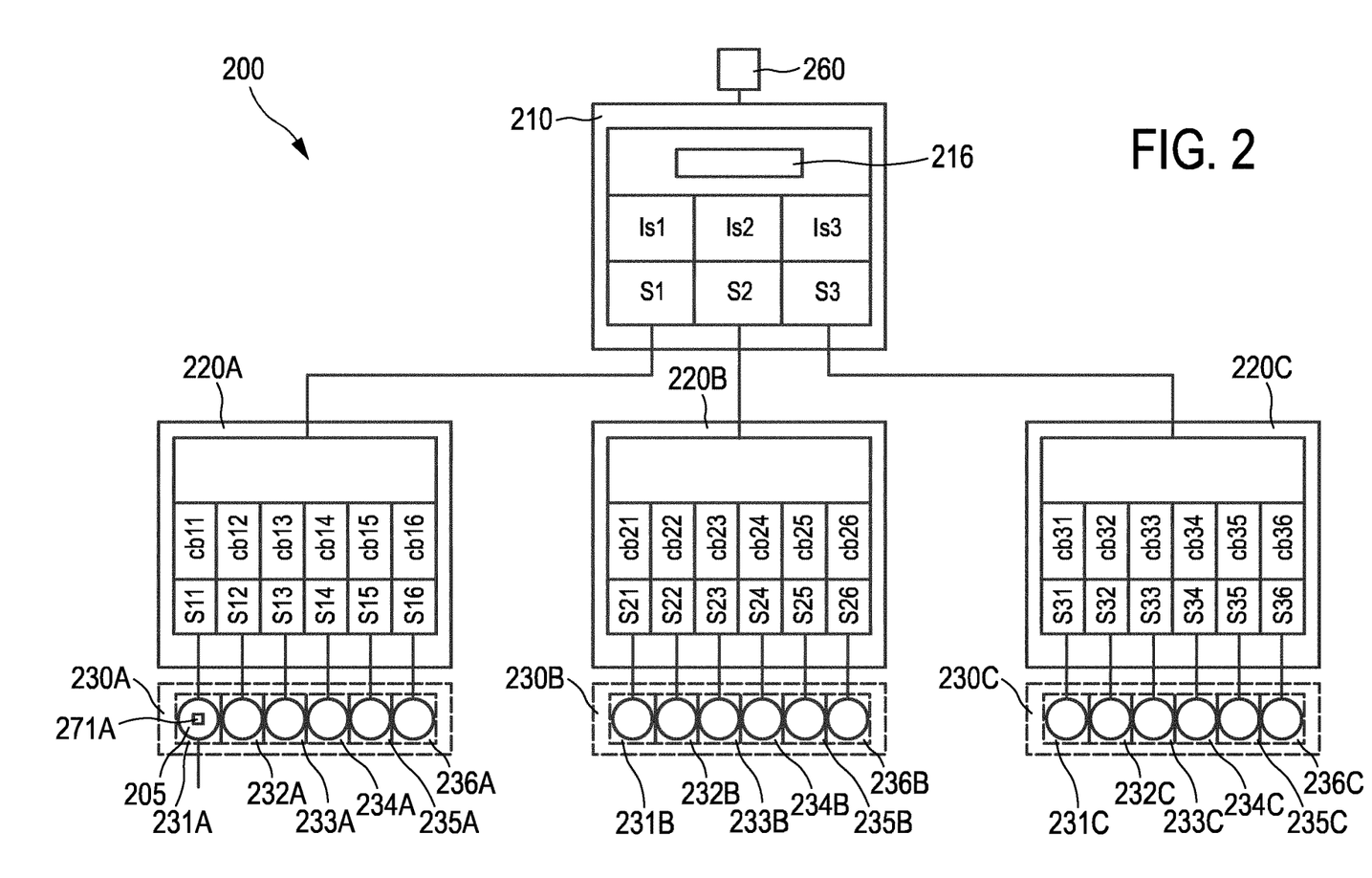
FIG. 2 shows schematically and exemplarily a second embodiment of the electrical load system.

FIG. 2 shows schematically and exemplarily a second embodiment of the electrical load system in form of a CL system 200. This second embodiment of the CL system 200 comprises electrical loads in form of luminaires 205, an electrical load grouping device in form of a smart meter 210 and subgrouping devices in form of fuse boxes 220A, 220B, and 220C.

The smart meter 210 includes a control unit 216, load switches ls1, ls2, and ls3 and electrical load sensors in form of power sensors S1, S2, and S3. The smart meter 210 is connected to mains 260 in order to provide CL system 200 with power. The fuse boxes 220A, 220B, and 220C respectively include circuit breakers cb11 to cb16, cb21 to cb26, cb31 to cb36, and electrical load sensors in form of power sensors S11 to S16, S21 to S26, and S31 to S36.

In other embodiments, the circuit breakers can be replaced by load switches or the load switches can be replaced by circuit breakers. Load switches arranged at the subgrouping devices can be remotely controlled, e.g., by the control unit of the electrical load grouping device, for example by power line communication. The load switches can be switched between an open and a closed state in order to open or close a connection. The circuit breakers automatically switch to an open state in order to open a connection when a threshold value of an electrical parameter is exceeded, e.g., a threshold current value is exceeded, in order to protect the electrical loads from damage. The circuit breakers can additionally be switched between the open and a closed state in order to open or close the connection. In other embodiments the electrical load grouping device can be any other type of electrical load grouping device for grouping electrical loads. The power sensors can also be any other type of electrical load sensor for measuring changed values of one or more electrical parameters. The electrical loads can also include switches, sensors, HVAC devices, or other types of electrical loads.

The smart meter 210 of the CL system 200 has similar functions as the smart meter 110 of the first embodiment of the CL system 100. In contrast to the first embodiment of the CL system 100, in this embodiment some of the power sensors are arranged in series to another power sensor. In particular, power sensors S11, S12, S13, S14, S15, and S16 are arranged in series with power sensor S1, power sensors S21, S22, S23, S24, S25, and S26 are arranged in series with power sensor S2, and power sensors S31, S32, S33, S34, S35, and S36 are arranged in series with power sensor S3. The power sensors S1, S2, and S3 are arranged in parallel. Also the power sensors S12, S13, S14, S15, and S16, as well as S21, S22, S23, S24, S25, and S26, as well as S31, S32, S33, S34, S35, and S36 are arranged in parallel. Arranging power sensors in series allows to assign a respective electrical load to a subgroup of a group of electrical loads as described in more detail below in the text.

The power sensors S1 to S36 measure power as an electrical parameter. In other embodiments, the electrical load sensors can measure any other electrical parameter, such as voltage or current. The power sensor S1 is connected to the load switch ls1, power sensor S2 is connected to the load switch ls2, and power sensor S3 is connected to load switch ls3. Sensor S11 is connected to its respective circuit breaker cb11. The sensors S12 to S36 are connected to their respective circuit breaker cb12 to cb36. In other embodiments the electrical load sensors can be included into the load switches or circuit breakers.

The control unit 216 includes a memory, a processor, and a transceiver (not shown). The memory includes a database with a LUT for storing assignments of the luminaires 205 to groups. The memory additionally includes computer program products for operating the smart meter 210, for grouping luminaires 205, and for operating the CL system 200. The transceiver triggers a changed power consumption of a respective luminaire 205 by providing a change power consumption signal to the respective luminaire 205. In this embodiment a dim level of the luminaire 205 is changed. A changed power value can be measured by the power sensors S11 and S1 in reaction to the changed power consumption of the luminaire 205. The processor processes data. In particular, the processor assigns the luminaire 205 to groups based on which power sensors measured a changed power value in reaction to the changed power consumption of the respective luminaire 205.

If, for example, a changed power consumption is triggered for the luminaire 205 connected to the fuse box 220A via power sensor S11, the power sensors S11 and S1 measure a changed power value. Since power sensor S1 measured a changed power value, the luminaire 205 is assigned to group 230A and since power sensor S11 measured a changed power value, the luminaire 205 is additionally assigned to group 231A. Group 231A is a subgroup of group 230A. In this embodiment the subgroup 231A includes only one luminaire. In other embodiments, subgroups can include further luminaires or other electrical loads. Since power sensor S11 is arranged in series with power sensor S1, the luminaire 205 can be assigned to two different groups, of which one is a subgroup of the other. This allows for a better control of the luminaire 205, as the luminaire 205 can be activated by commands addressing group 230A or 231A. In case that group 230A is addressed, also all luminaires 205 connected to the fuse box 220A and the smart meter 210 via power sensor S1 are addressed. In case that group 231A is addressed, only the luminaire 205 connected to the fuse box 220A via power sensor S11 is addressed.

In this embodiment, the smart meter 210 can assign the luminaires 205 to three different groups 230A, 230B, and 230C and to subgroups 231A to 236C based on which of the power sensors S1 to S36 measures a changed power value in reaction to a changed power consumption of a respective luminaire 205. In this embodiment, all luminaires 205 connected to the smart meter 210 via the power sensor S1 are assigned to group 230A as power sensor S1 measures a changed voltage value in reaction to a changed power consumption of any of the luminaires 205 connected to the smart meter 210 via power sensor S1. The luminaires 205 connected to the smart meter 210 via power sensor S2 are assigned to the group 230B, and the luminaires 205 connected to the smart meter 210 via power sensor S3 are assigned to group 230C. The luminaires 205 are additionally assigned to a subgroup in this embodiment, i.e., each luminaire 205 is assigned to a subgroup associated to the power sensor S11 to S36 to which the respective luminaire 205 is connected to.

The load switches ls1, ls2, and ls3 allow to connect or disconnect the groups 230A, 230B, and 230C from mains 260.

The circuit breakers cb11 to cb16, cb21 to cb26, and cb31 to cb36 allow for automatically disconnecting the luminaires of the subgroups 231A to 236C in order to protect them from damage. The circuit breakers cb11 to cb16, cb21 to cb26, and cb31 to cb36 furthermore allow for connecting the respective subgroups 231A to 236C in order to provide the luminaires 205 with power from mains 260 via the smart meter 210.

The electrical load system 200 furthermore includes an event sensor in form of motion sensor 271A for detecting a motion event, e.g., of a person. In other embodiments, the event sensor can be any other type of event sensor configured for detecting an event. The motion sensor 271A is included in luminaire 205. In other embodiments, one or more event sensors can also be arranged at different locations of the electrical load system, e.g., included in one of the subgrouping devices or included in other electrical loads. In this embodiment the fuse box 220A connects and disconnects the subgroup 231A of luminaire 205 based on detected motion events. The motion sensor 271A sends control signals to the circuit breaker cb11 in order to connect or disconnect the subgroup 231A of luminaire 205 based on detected motion events. The motion sensor 271A is optional.

In other embodiments also each of the electrical loads or a number of electrical loads can comprise an event sensor for detecting an event. The subgrouping device can be configured for connecting and disconnecting the subgroup or subgroups of electrical loads with the subgrouping device based on the detected event.

In other embodiments the luminaires, load switches, and/ or circuit breakers can be controlled by a remote control unit. The remote control unit can for example include a user interface for manually controlling the electrical load system. The control unit, e.g. the remote control unit, can be configured for controlling the electrical load system based on detected events. For example, the control unit can cause the electrical load grouping device and/or the subgrouping device for connecting or disconnecting the group and/or subgroup of electrical loads with the electrical load grouping device and/or the subgrouping device based on the detected event. In one case for example, luminaires of a subgroup can be activated when a motion is detected by a motion sensor in proximity to or included in the luminaires of the subgroup, e.g., in an area or a room.

Figure 3:
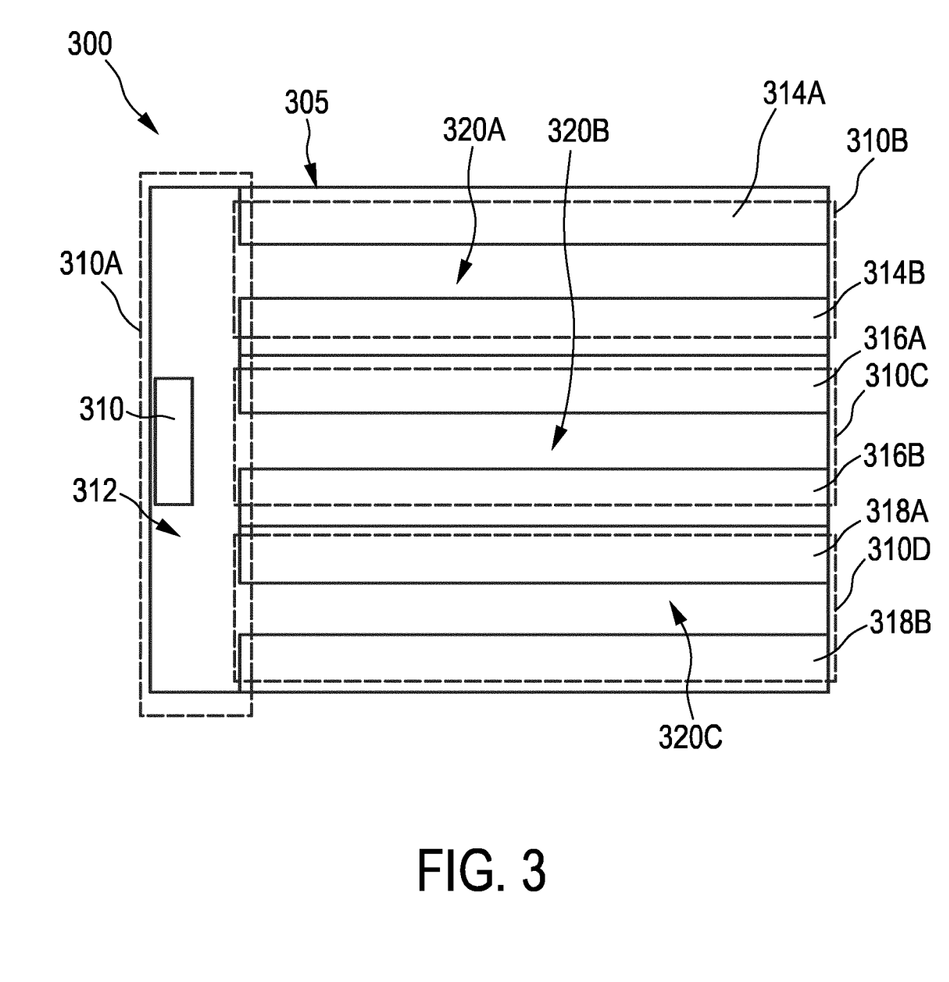
FIG. 3 shows schematically and exemplarily a third embodiment of the electrical load system.

FIG. 3 shows schematically and exemplarily a third embodiment of an electrical load system in form of a CL system 300 including four groups 310A, 310B, 310C, and 310D of electrical loads in form of luminaires (not shown).

In this embodiment, CL system 300 is arranged in a room 305 of a warehouse. In other embodiments, the CL system 300 can also be arranged in a floor of a building. The room 305 of the warehouse comprises a main aisle 312 and high racks 314A, 314B, 316A, 316B, 318A, and 318B, which are accessible via side aisles 320A, 320B, and 320C. Each of the side aisles 320A, 320B, and 320C can be accessed via the main aisle 312. The luminaires in each of the side aisles 320A, 320B, and 320C can be grouped using an electrical load grouping device as explained with respect to the embodiments presented in FIG. 1 or FIG. 2. In this embodiment an electrical load grouping device in form of a smart meter 310 is used for grouping the luminaires. Each group 310A, 310B, 310C, and 310D can be switched on and off via load switches included in the smart meter 310. The load switches are connected to a wall mounted manual control switch via wires (not shown here). In other embodiments the load switches can be connected wirelessly to a control unit which can include a user interface.

In this embodiment, each of the luminaires comprises an event sensor in form of a motion sensor. In other embodiments, the electrical load system can also include any other type of event sensors, e.g., presence sensors. The event sensors can also be distributed in the electrical load system and do not need to be included in the electrical loads.

The motion sensor detects a motion, e.g. of a person. The motion sensor provides a motion detection signal to the smart meter 310 when a motion is detected or when no motion is detected anymore. This causes the smart meter 310 to connect or disconnect the groups of luminaires 310A, 310B, 310C, and 310D based on the detected event, i.e., no motion or a motion. This allows for providing power to luminaires of the group or groups of luminaires which detect a motion in order to provide lighting only in the aisles that require lighting. In particular, the group or groups 310A, 310B, 310C, and 310D of luminaires will be switched off when nobody is in the respective aisle in which the luminaires of the respective group are arranged. The group or groups 310A, 310B, 310C, and 310D of luminaires will be switched on when a person approaches the respective aisle and motion is detected by one of the motion sensors.

In other embodiments, the event sensors can also be arranged such that the luminaires of the group 310B, 310C, and 310D are switched on when somebody approaches an entrance of their respective aisle 320A, 320B, and 320C. In other embodiments, the event sensor arranged in a respective electrical load can activate only the respective electrical load when an event is detected.

Figure 4:
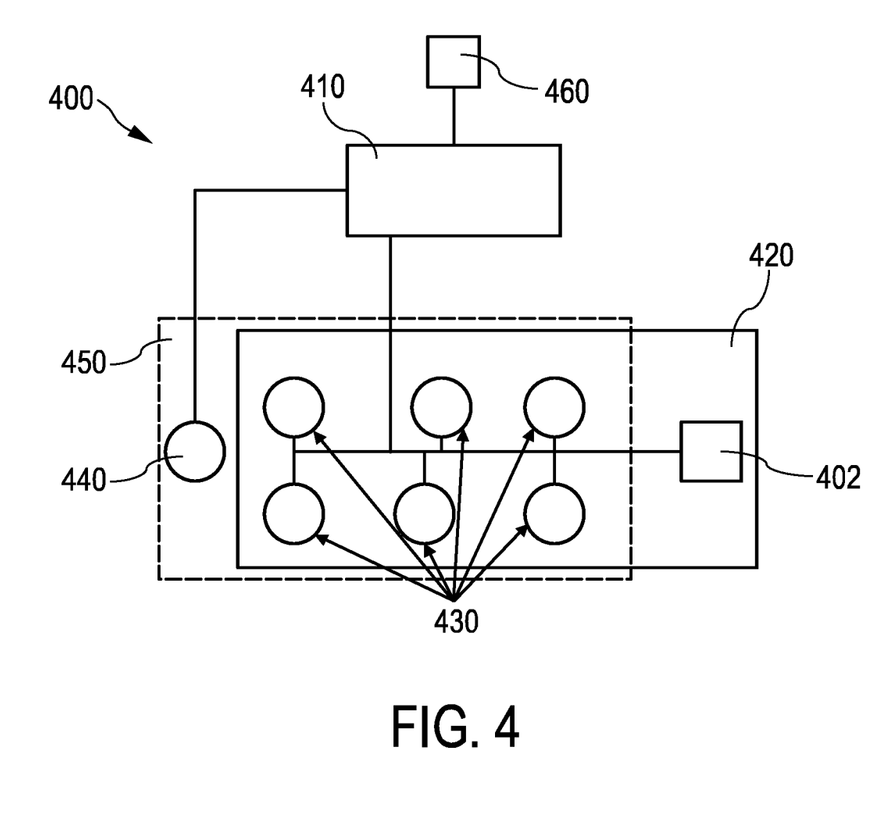
FIG. 4 shows schematically and exemplarily a fourth embodiment of an electrical load system.

FIG. 4 shows schematically and exemplarily a fourth embodiment of an electrical load system in form of a CL system 400. The CL system 400, as the previous embodiments can be used for grouping electrical loads including luminaires and for providing lighting.

The CL system 400 comprises a wall mounted manually operated switch 402, an electrical load grouping device in form of a smart meter 410, luminaires 430 arranged in a room 420, and a luminaire 440 arranged in proximity to the room 420.

All luminaires 430 and 440 are connected to the smart meter 410 and are provided with power from mains 460 via the smart meter 410. The luminaires 430 are connected to the wall mounted manually operated switch 402 and can be controlled by it. The wall mounted manually operated switch 402 is arranged in room 420. Luminaire 440 is not connected to the wall mounted manually operated switch 402.

In this embodiment, the electrical load sensors (not shown) are arranged such that luminaires 430 and 440 are assigned to a group 450 of luminaires by the smart meter 410. Therefore, when the wall mounted manually operated switch 402 is switched, luminaires 430 are activated and a corresponding group activation signal is provided to the smart meter 410 for causing the smart meter 410 to provide power to the group 450. The smart meter 410 in reaction to the group activation signal provides power to the luminaires 430 and 440 of the group 450 and additionally activates luminaire 440. Thus, switching the manually operated switch 402 allows controlling more luminaires than are connected to it. For example, the luminaire 440 can be a front door lamp, the luminaires 430 can be corridor luminaires and wall mounted manually operated switch 402 can be a corridor light switch. When the corridor light switch 402 is switched, the front door lamp 440 and the corridor luminaires 430 are activated or deactivated.

Figure 5:
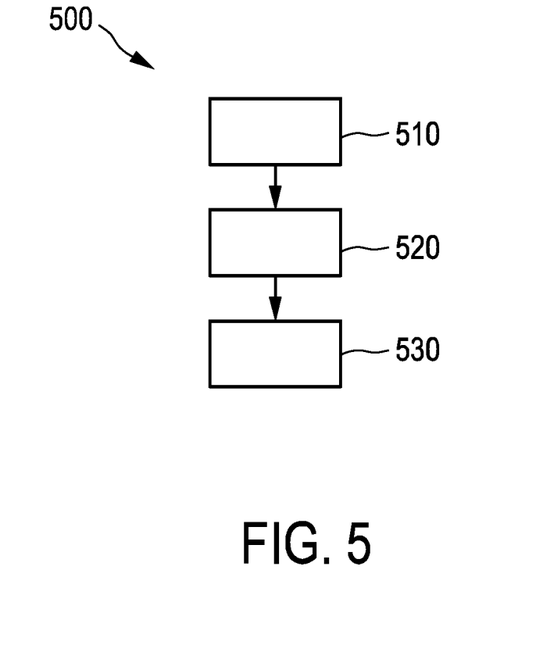
FIG. 5 shows an embodiment of the method for operating an electrical load grouping device.

FIG. 5 shows an embodiment of a method 500 for operating an electrical load grouping device, e.g. the smart meter of the CL system described in one of the FIG. 1 to FIG. 4. In other embodiments, another electrical load grouping device of another electrical load system can be operated using the method.

In step 510, the smart meter transmits a change power consumption signal to a respective luminaire for changing its power consumption. In this embodiment, the change power consumption signal causes the luminaire to change its dim level and thus also its power consumption. Step 510 is optional. Alternatively, another method for triggering a change of the power consumption of a respective electrical load can be used.

In step 520, the smart meter receives a changed power value from one or more of the power sensors in reaction to a changed power consumption of the respective luminaire. In other embodiments a changed value of any other electrical parameter can be received from one or more of the electrical load sensors in reaction to a changed power consumption of the respective electrical load.

In step 530, the smart meter assigns the respective luminaire to a group of luminaires associated to the power sensor or groups of luminaires associated to the power sensors which measured the changed power value received in reaction to the changed power consumption of the respective luminaire. In other embodiments, the respective electrical load can also be assigned to a group based on which electrical load sensor or which electrical load sensors measured the changed value of the electrical parameter received in reaction to the changed power consumption of the respective electrical load.

The method can be performed for all luminaires of the CL system in order to assign all of them to one or more groups of luminaires.

The assignments of the luminaires to the groups can be stored in a database, for example in a LUT including luminaire identifiers and group identifiers. The LUT can be used for addressing luminaires of one or more groups simultaneously.

Figure 6:
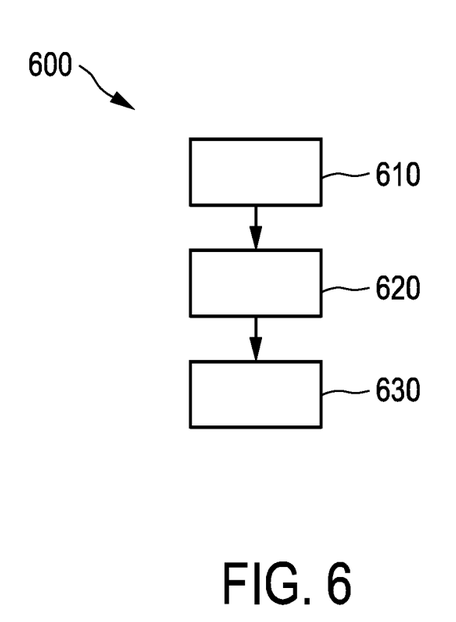
FIG. 6 shows an embodiment of the method for grouping electrical loads of an electrical load system.

FIG. 6 shows an embodiment of the method 600 for grouping electrical loads of an electrical load system in which at least one electrical load sensor is arranged in series with another electrical load sensor, e.g. the CL system described in FIG. 2. Step 510 is similar to step 610 and step 520 is similar to step 620.

In step 610, the smart meter transmits a change power consumption signal to a respective luminaire for changing its power consumption. Step 610 is optional.

In step 620, the smart meter receives a changed power value from one or more of the power sensors in reaction to a changed power consumption of the respective luminaire.

In step 630, the smart meter assigns the respective luminaire to a group of luminaires and a subgroup of the group of luminaires that measured the changed power value received in reaction to the changed power consumption of the respective luminaire. The group of electrical loads is associated to the power sensor and the subgroup is associated to another power sensor that is arranged in series with the power sensor. This allows to assign an electrical load to more than one group and thus control of the electrical loads can be improved by addressing groups or subgroups.

The method can be performed for all luminaires of the CL system in order to assign all of them to groups and subgroups of luminaires.

The assignments of the luminaires to the groups and subgroups can be stored in a database, for example in a LUT including luminaire identifiers and group identifiers. An individual group identifier can be assigned to each group and each subgroup. The LUT can be used for addressing luminaires of one or more groups and subgroups simultaneously.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein the electrical load system is a HVAC system including one or more HVAC devices that includes one or more of the following devices: an air conditioning device, a heating device, a ventilating device, a humidity device, and/or a cooling device.

Other variations to the disclosed embodiments can be understood and effected by those skilled in the art in practicing the claimed invention, from a study of the drawings, the disclosure, and the appended claims.

In the claims, the word "comprising" and "including" does not exclude other elements or steps, and the indefinite article "a" or "an" does not exclude a plurality.

A single unit, processor, or device may fulfill the functions of several items recited in the claims. The mere fact that certain measures are recited in mutually different dependent claims does not indicate that a combination of these measures cannot be used to advantage.

Operations like grouping electrical loads arranged at different locations in an electrical load system based on measurements of an electrical parameter at electrical load sensors, which are arranged such that each of them can measure the electrical parameter of one or more of the electrical loads, receiving a changed value of the electrical parameter from one or more of the electrical load sensors in reaction to a changed power consumption of a respective electrical load, assigning the respective electrical load to a group of electrical loads associated to an electrical load sensor or groups of electrical loads associated to electrical load sensors based on which electrical load sensor or which electrical load sensors measured the changed value of the electrical parameter received in reaction to the changed power consumption of the respective electrical load, et cetera, performed by one or several units of the electrical load grouping device can be performed by any other number of units of the electrical load grouping device. These operations and/or the method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention is directed to electrical load grouping based on measurements of an electrical parameter at electrical load sensors. An electrical load grouping device is configured for receiving a changed value of the electrical parameter from one or more of the electrical load sensors in reaction to a changed power consumption of a respective electrical load. The electrical load grouping device is further configured for assigning the respective electrical load to a group of electrical loads associated to an electrical load sensor or groups of electrical loads associated to electrical load sensors based on which electrical load sensor or which electrical load sensors measured the changed value of the electrical parameter received in reaction to the changed power consumption of the respective electrical load. This allows automatic grouping of electrical loads in an electrical load system.

The invention claimed is:

1. An electrical load grouping device for grouping a subset of electrical loads in an electrical load system arranged at different locations for subsequent wireless control of the subset of electrical loads comprising:
   a load switch and/or a circuit breaker, wherein the load switch and/or the circuit breaker connects and disconnects a plurality of electrical loads in the electrical load system;
   a transceiver, wherein the transceiver receives communication from a plurality of remotely located electrical load sensors, wherein each of the plurality of remotely located electrical load sensors measure an electrical parameter associated with power consumption of a respective electrical load or respective group of electrical loads of the plurality of electrical loads;
   a control unit in communication with the transceiver and the load switch and/or the circuit breaker, wherein the control unit:
   disconnects the plurality of electrical loads by triggering the load switch and/or the circuit breaker, wherein such disconnection changes the electrical parameter of the plurality of electrical loads,
   subsequent to disconnecting the plurality of electrical loads, receives via the transceiver, an indication of a changed value of the electrical parameter from the plurality of remotely located electrical load sensors associated with the disconnection, and
   assigns the plurality of electrical loads to a group identifier of the subset of electrical loads based on which of the plurality of remotely located electrical load sensors transmitted the indication of the changed value of the electrical parameter associated with the disconnection, wherein a subsequent control signal associated with the group identifier allows for the subset of electrical loads to be controlled as a group simultaneously.

2. The electrical load grouping device according to claim 1, further comprising a database in communication with the control unit for storing assignments of the group identifier.

3. The electrical load grouping device according to claim 1, wherein the plurality of remotely located electrical load sensors are arranged such that one of the plurality of remotely located electrical load sensors can measure the electrical parameter of more than one electrical load.

4. The electrical load grouping device according to claim 3, wherein at least one of the plurality of electrical loads comprises an event sensor for detecting an event.

* * * * *